United States Patent
Hua et al.

(10) Patent No.: US 11,271,030 B2
(45) Date of Patent: Mar. 8, 2022

(54) DETECTION PANEL AND MANUFACTURING METHOD THEREOF

(71) Applicants: BOE TECHNOLOGY GROUP CO., LTD., Beijing (CN); KA IMAGING INC., Ontario (CA)

(72) Inventors: Gang Hua, Beijing (CN); Chuncheng Che, Beijing (CN); Cheng Li, Beijing (CN); Jian Wang, Beijing (CN); Yanna Xue, Beijing (CN); Yong Zhang, Beijing (CN); Chia Chiang Lin, Beijing (CN)

(73) Assignees: BOE TECHNOLOGY GROUP CO., LTD., Beijing (CN); KA IMAGING INC., Kitchener (CA)

(*) Notice: Subject to any disclaimer, the term of this patent is extended or adjusted under 35 U.S.C. 154(b) by 0 days.

(21) Appl. No.: 16/965,941

(22) PCT Filed: Jan. 16, 2020

(86) PCT No.: PCT/CN2020/072493
§ 371 (c)(1),
(2) Date: Jul. 29, 2020

(87) PCT Pub. No.: WO2020/173241
PCT Pub. Date: Sep. 3, 2020

(65) Prior Publication Data
US 2021/0233954 A1 Jul. 29, 2021

(30) Foreign Application Priority Data
Feb. 26, 2019 (CN) .......................... 201910142562.2

(51) Int. Cl.
*G01T 1/20* (2006.01)
*H01L 27/146* (2006.01)

(52) U.S. Cl.
CPC ...... *H01L 27/14661* (2013.01); *G01T 1/2018* (2013.01); *H01L 27/1469* (2013.01)

(58) Field of Classification Search
CPC .......... H01L 27/14661; H01L 27/1469; G01T 1/2018
See application file for complete search history.

(56) References Cited

U.S. PATENT DOCUMENTS 9,335,422 B2   5/2016   Oda
9,705,024 B2   7/2017   Jiang et al.
(Continued)

FOREIGN PATENT DOCUMENTS

CN   1989624 A     6/2007
CN   101359656 A   2/2009
(Continued)

OTHER PUBLICATIONS

First Chinese Office Action Application No. 201910142562.2; dated Jul. 24, 2020.
(Continued)

*Primary Examiner* — Kiho Kim

(57) ABSTRACT

A detection panel and a manufacturing method thereof are disclosed. The detection panel includes a first substrate and a second substrate, and the first substrate includes a light detection layer; the second substrate includes a drive circuit; the first substrate and the second substrate are opposite to each other for cell assembly, and the drive circuit is coupled to the light detection layer to read a photosensitive signal generated by the light detection layer.

20 Claims, 5 Drawing Sheets

(56) References Cited

U.S. PATENT DOCUMENTS

| | | | |
|---|---|---|---|
| 10,690,786 B2 | 6/2020 | Tian | |
| 2007/0018075 A1* | 1/2007 | Cazaux | H01L 27/14609 250/208.1 |
| 2008/0001148 A1* | 1/2008 | Nishi | H01L 27/1469 257/53 |
| 2008/0135766 A1 | 6/2008 | Nam et al. | |
| 2009/0200479 A1 | 8/2009 | Nomura et al. | |
| 2011/0204247 A1* | 8/2011 | Kasai | C09K 11/628 250/370.11 |
| 2013/0099098 A1* | 4/2013 | Kobayashi | H01L 27/14609 250/208.1 |
| 2013/0105924 A1* | 5/2013 | Kobayashi | H01L 27/1464 257/431 |
| 2014/0021365 A1* | 1/2014 | Oda | G01T 1/17 250/395 |
| 2015/0263061 A1 | 9/2015 | Karim | |
| 2020/0020736 A1 | 1/2020 | Liang et al. | |

FOREIGN PATENT DOCUMENTS

| | | |
|---|---|---|
| CN | 101383360 A | 3/2009 |
| CN | 101459186 A | 6/2009 |
| CN | 103536300 A | 1/2014 |
| CN | 105118840 A | 12/2015 |
| CN | 106206636 A | 12/2016 |
| CN | 106653789 A | 5/2017 |
| CN | 107831523 A | 3/2018 |
| CN | 108962928 A | 12/2018 |
| CN | 109346488 A | 2/2019 |
| CN | 109830563 A | 5/2019 |
| JP | 2005116543 A | 4/2005 |

OTHER PUBLICATIONS

Second Chinese Office Action Application No. 201910142562.2; dated Apr. 2, 2021.

\* cited by examiner

DETECTION PANEL AND MANUFACTURING METHOD THEREOF

The present application claims the priority of Chinese patent application No. 201910142562.2 filed on Feb. 26, 2019, the entire disclosure of the aforementioned application is incorporated by reference as part of the disclosure of this application.

TECHNICAL FIELD

Embodiments of the present disclosure relate to a detection panel and a manufacturing method.

BACKGROUND

Recently, X-ray detection is widely used in various fields such as medical treatment, safety, non-destructive detection, scientific research, and the like. At present, a relatively common X-ray detection technology is the X-ray Digital Radiography (DR) detection technology that appeared in the late 1990s. The X-ray Digital Photography detection technology adopts a Flat Panel Detector (FPD) with a pixel size smaller than 0.1 mm, and thus the imaging quality and resolution thereof are almost comparable to a film photography system. In addition, it also overcomes the shortcomings of the film photography system, and thus facilitates the computer processing of images.

SUMMARY

At least an embodiment of the present disclosure provides a detection panel comprising a first substrate and a second substrate, the first substrate comprises a light detection layer; the second substrate comprises a drive circuit; and the first substrate and the second substrate are opposite to each other for cell assembly, and the drive circuit is coupled to the light detection layer to read a photosensitive signal generated by the light detection layer.

In an example, the first substrate further comprises a first base, the photosensitive element is located on the first base, and at least one of the first electrode and the second electrode is located at a side of the light detection layer away from the first base.

In an example, the photosensitive element is a metal-semiconductor-metal type of photosensitive element.

In an example, the first substrate comprises a first base, and the first electrode, the light detection layer, and the second electrode are stacked on the first base in sequence.

In an example, the first electrode is provided as an entire surface and in direct contact with the first base, and the second electrode is a block electrode or a slit electrode.

In an example, the first electrode is in direct contact with the first base.

In an example, the first electrode and the second electrode are both located at the side of the light detection layer away from the first base.

In an example, the first electrode and the second electrode are in the same layer and insulated from each other.

In an example, the photosensitive element further comprises a dielectric layer, and the dielectric layer is between the light detection layer and at least one of the first electrode and the second electrode.

In an example, the first substrate further comprises a first base and a buffer layer between the first base and the photosensitive element, and the buffer layer is provided as an entire surface and in direct contact with the first base.

In an example, the first substrate further comprises a first electrode, the second substrate further comprises a second electrode; and the first electrode, the second electrode and the light detection layer constitute a photosensitive element.

In an example, the second substrate further comprises a first electrode and a second electrode; and the first electrode, the second electrode and the light detection layer constitute a photosensitive element.

In an example, the drive circuit comprises a switching transistor, and the switching transistor is configured to be coupled to the light detection layer to determine whether to read the photosensitive signal from the light detection layer.

In an example, the drive circuit further comprises a detection electrode, and the detection electrode is electrically connected to a source electrode of the switching transistor or a drain electrode of the switching transistor, and is coupled to the photosensitive element.

In an example, the detection electrode is electrically connected to the second electrode of the photosensitive element or forms a capacitor with the second electrode of the photosensitive element.

In an example, the detection electrode is a light blocking layer, which at least partially covers the switching transistor with respect to the second substrate.

At least an embodiment of the present disclosure further provides a method of manufacturing a detection panel, which comprises: providing a first substrate comprising a light detection layer; providing a second substrate comprising a drive circuit; and assembling the first substrate and the second substrate to form a cell, so that the drive circuit is coupled to the light detection layer to read a photosensitive signal generated by the light detection layer.

In an example, the first substrate comprises a first base, and providing the first substrate comprises: forming a first electrode, the light detection layer and a second electrode on the first base in sequence; or forming the light detection layer on the first base, and forming the first electrode and the second electrode on the light detection layer, in which the first electrode and the second electrode are insulated from each other; and the first electrode, the second electrode, and the light detection constitute a photosensitive element.

In an example, forming the first electrode, the light detection layer and the second electrode on the first base in sequence comprises: forming the first electrode as a planar electrode and forming the second electrode as a block electrode or a slit electrode.

In an example, the first substrate comprises a first base, and providing the first substrate comprises: forming the light detection layer on the first base, and forming the first electrode and the second electrode on the light detection layer; and the first electrode, the second electrode and the light detection layer constitute a photosensitive element.

In an example, providing the first substrate further comprises forming a dielectric layer, and the dielectric layer is formed between the light detection layer and at least one of the first electrode and the second electrode.

BRIEF DESCRIPTION OF DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electric connection, directly or indirectly. "On," "under," "right," "left" and the like are only used to indicate relative position relationship, and when the position of the object which is described is changed, the relative position relationship may be changed accordingly.

Hereinafter the present disclosure will be described by several specific embodiments. For the clarity and the conciseness of the following description of the embodiments of the present disclosure, the detailed descriptions of known functions and known components can be omitted. When any component of the embodiments of the present disclosure appears in more than one drawing, the component is indicated by the same reference number in each drawing.

Figure 1A:
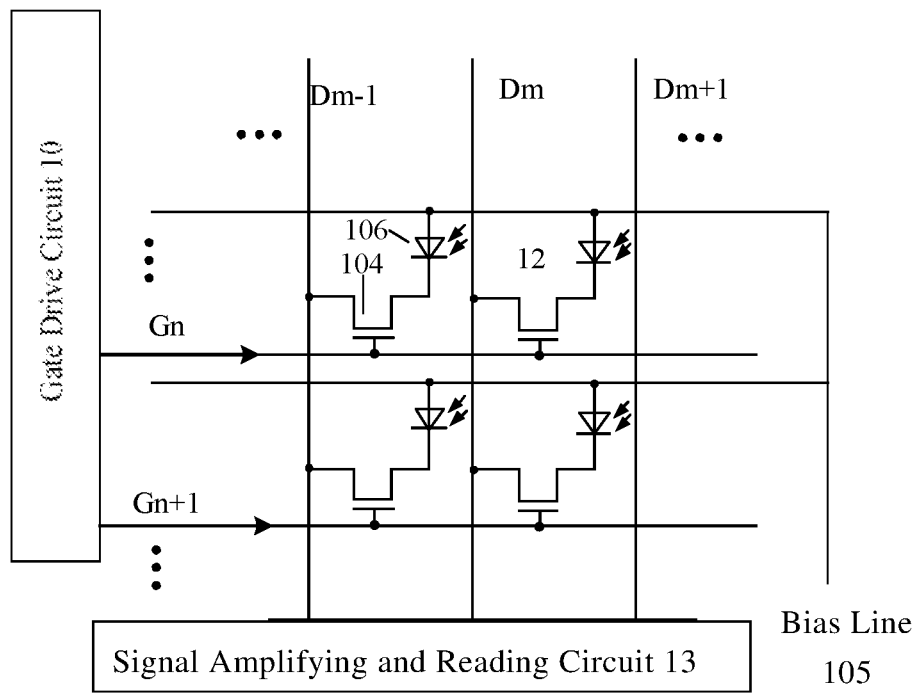
FIG. 1A is a schematic circuit diagram of a detection panel.

According to the different photoelectron conversion modes involved in imaging, the digital X-ray detection panels can be divided into two classes, namely, direct conversion type (Direct DR) and indirect conversion type (Indirect DR). FIG. 1A shows a schematic circuit diagram of an indirect conversion type detection panel. As shown in FIG. 1A, the indirect conversion type X-ray detection panel includes a gate drive circuit 10, a signal amplifying and reading circuit 13, and a plurality of pixel units 12 arranged in an array. For example, in an example, each pixel unit 12 includes a photosensitive element 106, a drive circuit for driving the photosensitive element 106, and an X-ray conversion layer (not shown in FIG. 1A) formed by a scintillator (cesium iodide) or a phosphor (gadolinium oxysulfide). For example, the drive circuit includes a switching transistor 104 and a storage capacitor (not shown in FIG. 1A), the switching transistor 104 is configured to be coupled to the photosensitive element 106 to determine whether to read a photosensitive signal from the photosensitive element 106, and the storage capacitor is configured to store the photosensitive signal.

As shown in FIG. 1A, the photosensitive element 106 is, for example, a photodiode, and the storage capacitor is formed by electrodes located on the upper and the lower sides of the photosensitive element 106, thereby providing a reverse bias capacitor; and the storage capacitor can also be provided separately. In another example, the photosensitive element 106 can be a metal-semiconductor-metal (MSM) type photosensitive element. In this case, the storage capacitor can be separately set to be connected to the photosensitive element in parallel or in series, which will be described in detail below. The switching transistor is, for example, a thin film transistor.

As shown in FIG. 1A, the gate drive circuit 10 is connected to N rows of pixel units 12 through N gate lines, respectively, the signal amplifying and reading circuit 13 is connected to M columns of pixel units 12 through M data lines, respectively, and the N rows of pixel units 12 are further connected to N bias lines 105 to receive bias voltages, respectively. As shown in FIG. 1A, Gn represents the gate line connected to the (n)th row of pixel units, Gn+1 represents the gate line connected to the (n+1)th row of pixel units, Dm−1 represents the data line connected to the (m−1)th column of pixel units, Dm represents the data line connected to the (m)th column of pixel units, and Dm+1 represents the data line connected to the (m+1)th column of pixel units.

The photodiode is in a turn-off state under action of the bias voltage (reverse voltage) provided by the bias line 105. When the array substrate is irradiated with an X-ray, the X-ray conversion layer converts the X-ray into a visible light (for example, a light with the wavelength in a range of 350 nm-770 nm); and when the photosensitive element 106 is irradiated with the visible light, the photosensitive element 106 converts the visible light into an electric signal which is stored in the storage capacitor (i.e., charging or discharging the storage capacitor). Then, the switching transistors 104 are turned on row by row under the action of gate scanning signals progressively provided by the drive circuit 10, and the electric signal stored in the storage capacitor is transmitted to the signal amplifying and reading circuit 13 through the data line; the signal amplifying and reading circuit 13 further performs amplifying, analog/digital conversion and other processing on the electrical signal to obtain a digital signal, and the digital signal is transmitted to an image processing system (e.g., a central processing unit (CPU) or a graphics processing unit (GPU), etc.) of a computer to generate an X-ray image.

Figure 1B:
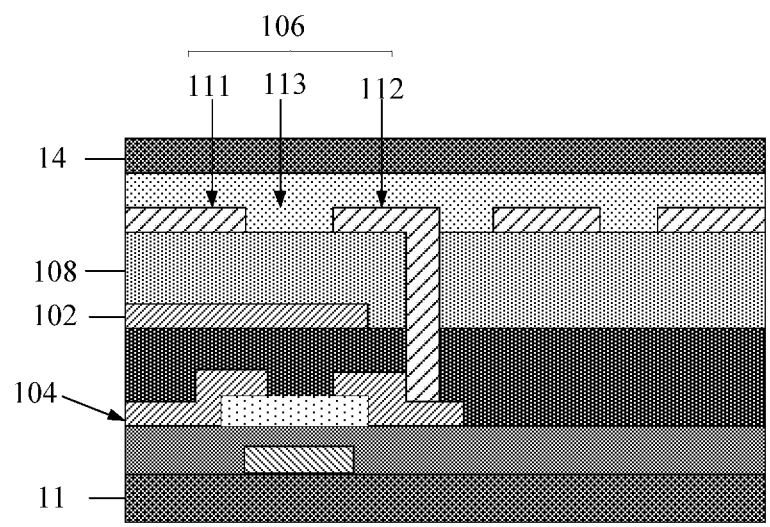
FIG. 1B is a schematic diagram of a cross-sectional structure of a detection panel.

FIG. 1B is a schematic diagram of a cross-sectional structure of a detection panel, which shows a partial cross-sectional structure of a pixel unit of the detection panel. For clarity, FIG. 1B only shows the switching transistor in the drive circuit. As shown in FIG. 1B, the detection panel includes a base substrate 11, a switching transistor 104 formed on the base substrate 11, a light blocking layer 102, an insulating layer 108, a photosensitive element 106, and a protective layer 14, etc. The photosensitive element 106 includes a first electrode 111, a second electrode 112 and a light detection layer 113, and the second electrode 112 is electrically connected to a source electrode of the switching transistor 104 or a drain electrode of the switching transistor 104 through a via-hole in the insulating layer 108. The first electrode 111 and the second electrode 112 are formed in the same layer on the insulating layer 108, and the light detection layer 113 is formed on the first electrode 111 and the second electrode 112, that is, formed on an electrode layer of the photosensitive element.

Figure 1C:
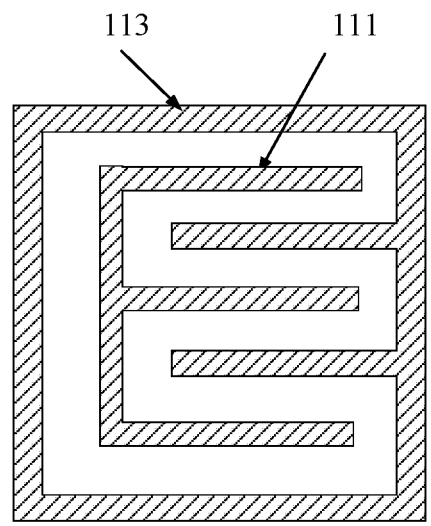
FIG. 1C shows a planar schematic diagram of an electrode layer of a photosensitive element in a pixel unit.

FIG. 1C shows a planar schematic diagram of the electrode layer of the photosensitive element in a pixel unit as shown in FIG. 1B. As shown in FIG. 1C, the first electrode 111 and the second electrode 112 are both slit electrodes (comb-shaped electrodes) which form an interdigital structure with each other.

In the structure of the detection panel as shown in FIG. 1B, the light detection layer and the drive circuit are formed on the same substrate. For obtaining a higher photosensitive area and a higher filling rate, the light detection layer is formed after forming the switching transistor and the electrode layer including the first electrode 111 and the second electrode 112, so that the light detection layer is formed on an uneven surface with a slope. For example, in the pattern of the electrode layer with the interdigital structure as shown in FIG. 1C, the width of the slit is often greater than 10 μm, and two sides of the electrode strip have slopes. The light detection layer is easily affected by the slope so as to cause the unevenness of the interface. This unevenness may cause defects in the detection layer, thereby causing serious lateral leakage current in the dark state, which greatly affects the performance and yield of the photosensitive element.

At least an embodiment of the present disclosure provides a detection panel including a first substrate and a second substrate, the first substrate includes a light detection layer; the second substrate includes a drive circuit; and the first substrate and the second substrate are opposite to each other for cell assembly, and the drive circuit is coupled to the light detection layer to read a photosensitive signal generated by the light detection layer.

In the detection panel provided by at least an embodiment of the present disclosure, the light detection layer and the drive circuit are formed on two substrates, respectively. On the one hand, in some examples, it helps to provide a flat formation interface for the light detection layer, thereby reducing the defects of the light detection layer and improving the performance of the photosensitive element; on another hand, the separation design can reduce the number of processes on a single substrate (for example, avoiding more than 10 photomask processes), which not only helps to improve the product yield, but also can improve the production efficiency; and on still another hand, the first substrate for forming the light detection layer can protect the second substrate for forming the drive circuit.

Figure 2A:
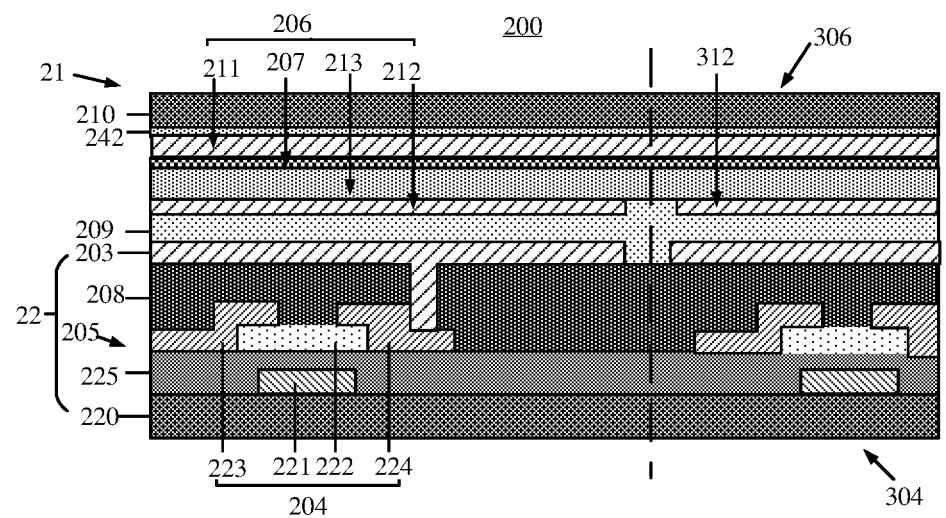
FIG. 2A is a schematic diagram of a cross-sectional structures of a detection panel provided by an embodiment of the present disclosure.

FIG. 2A is a schematic diagram of a cross-sectional structure of a detection panel provided by an embodiment of the present disclosure. As shown in FIG. 2A, the detection panel 200 includes a first substrate 21 and a second substrate 22, and the first substrate 21 includes a light detection layer 213 for forming a photosensitive element. The second substrate 22 includes a drive circuit 205 for driving the photosensitive element. The first substrate 21 and the second substrate 22 are opposite to each other for cell assembly to form the detection panel, and the drive circuit 205 is coupled to the light detection layer 213 to read a photosensitive signal generated by the light detection layer 213 in operation, and can further transmit the obtained photosensitive signal to a signal processing circuit.

It should be noted that "coupled/coupling" as used herein means that a signal transmission can be performed between the drive circuit 205 and the light detection layer 213, e.g., a signal transmission via electric field, magnetic field, DC, AC, electromagnetic wave, etc., including both the case that the drive circuit 205 and the light detection layer 213 are directly electrically connected to each other and the case that a signal transmission is performed between the drive circuit 205 and the light detection layer 213 via device (such as, capacitor) coupling. The embodiments of the present disclosure do not limit thereto.

For example, as shown in FIG. 2A, the first substrate 21 further includes a first electrode 211 and a second electrode 212, the first electrode 211, the second electrode 212 and the light detection layer 213 constitute a photosensitive element 206, and the first electrode 211 and the second electrode 212 are configured to apply an electric signal to the light detection layer 213 or acquire an electric signal from the light detection layer 213.

In the present embodiment, as shown in FIG. 2A, both the first electrode 211 and the second electrode 212 are included in the first substrate 21.

For example, as shown in FIG. 2A, the first substrate 21 includes the first electrode 211, and the second substrate includes the second electrode 212. Upon cell assembly of the first substrate and the second substrate, the first electrode 211, the second electrode 212 and the light detection layer 213 constitute the photosensitive element 206. The embodiments of the present disclosure are not limited in this aspect.

In other embodiments, at least one of the first electrode 211 and the second electrode 212 can also be in the second substrate 22, that is, the electrode(s) and the light detection layer of the photosensitive element can be in different substrates.

Figure 4A:
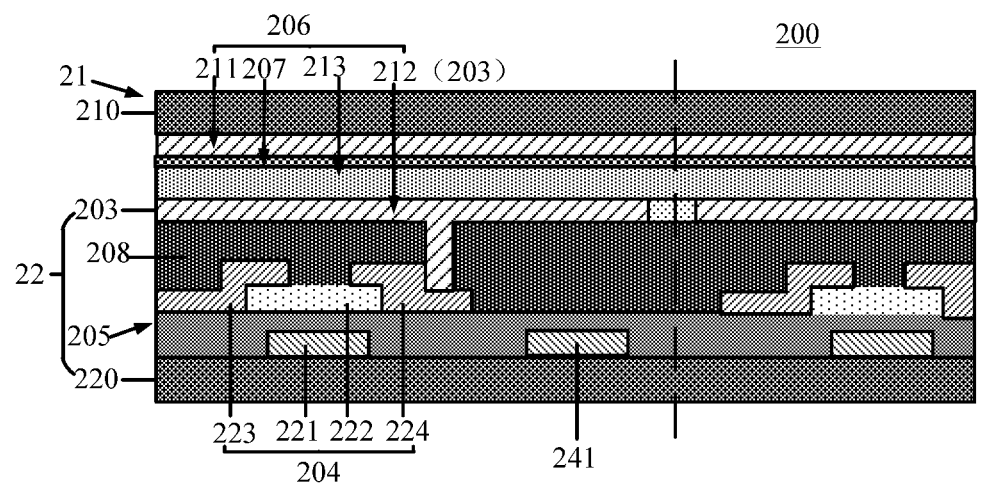
FIG. 4A is a schematic diagram of a cross-sectional structure of a detection panel provided by yet another embodiment of the present disclosure.

For example, the first substrate 21 includes the first electrode 211, and the second substrate 22 includes the second electrode 212 (as shown in FIG. 4A). When the first substrate 21 and the second substrate 22 are assembled to form a cell, e.g., bonded with a conductive adhesive or an insulated adhesive, the second electrode 212 in the second substrate 22 and the light detection layer 213 in the first substrate 21 are coupled to form the photosensitive element 206. In this case, for example, the drive circuit 205 can be electrically connected to the second electrode 212, and thus coupled to the light detection layer 213.

For example, both the first electrode 211 and the second electrode 212 are in the second substrate 22. When the first substrate 21 and the second substrate 22 are assembled to form a cell, e.g., bonded with a conductive adhesive or an insulated adhesive, the first electrode 211 and the second electrode 212 in the second substrate 22 and the light detection layer 213 in the first substrate 21 are coupled to form the photosensitive element 206.

The embodiments of the present disclosure do not limit the relative positions of the first electrode, the second electrode and the light detection layer of the photosensitive element. In the photosensitive element, the electrode(s) and the light detection layer can be coupled via direct contact to form the photosensitive element, and can also be coupled via a dielectric layer to form the photosensitive element, and the dielectric layer can adopt, e.g., a conductive material or an insulated material.

In the aforesaid embodiments, the light detection layer 213 and the drive circuit 205 are formed on different substrates, and the second electrode 212 are formed after the light detection layer 213, so the light detection layer 213 can have a flat formation interface, while the drive circuit 205 and the slope of the pattern of the second electrode 212 do not affect the deposition of the light detection layer 213. Therefore, the present embodiment increases the flatness of the light detection layer 213 and reduces the defects therein, thereby reducing the leakage current in the dark state.

For example, as shown in FIG. 2A, the first substrate 21 further includes a first base 210, and the photosensitive element 206 is on the first base 210. For example, at least one of the first electrode 211 and the second electrode 212 is located at a side of the light detection layer 213 away from the first base 210.

As shown in FIG. 2A, the first electrode 211, the light detection layer 213 and the second electrode 212 are stacked on the first base 210 in sequence, that is, the photosensitive element 206 has a vertical-stacked structure. For example, the first electrode 211 is disposed on the entire surface of the first base 210 (that is, a planar structure), that is, a plurality of pixel units share the same first electrode 211, and thus it has a flat surface. The second electrode 212 is a block electrode or a slit electrode, and the second electrodes 212 of various pixel units are spaced from each other for insulation. As shown in FIG. 2A, the dashed line represents the boundary between pixel units, and the second electrode 212 are disconnected at the boundary.

The photosensitive area of the detection panel is an area of the photosensitive element for receiving a light. For example, in the present embodiment, the photosensitive area of the photosensitive element 206 is the area of the first electrode 211, and thus arranging the first electrode 211 as an entire surface can allow the detection panel to obtain a higher photosensitive area and filling rate (the ratio of the photosensitive area in the detection panel). For example, for pixel units with a pitch of 140 μm, the filling rate of the detection panel can reach 94.3%.

For example, in at least one example, the first electrode 211 directly contacts the first base 210, that is, the photosensitive element 206 directly contacts the first base 210. In this case, the first electrode 211 is directly formed on the first base 210 without using an intermediate layer structure such as a buffer layer.

For example, as shown in FIG. 2A, the first substrate 21 further includes a buffer layer 242 between the first base 210 and the photosensitive element 206. For example, the buffer layer 242 is provided as an entire surface and directly contacts the first base 210. For example, the photosensitive element 206 directly contacts the buffer layer. For example, the buffer layer 242 can improve the flatness of the surface of the first base 210, thereby helping to further improve the flatness of the formation interface of the light detection layer 213. For example, the buffer layer 242 can also increase the adhesion between the first electrode 211 and the first base 210. For example, the material of the buffer layer can be silicon oxide, silicon nitride, or other inorganic insulating layer material.

For example, the first electrode 211 can be a transparent electrode to increase the light transmittance. For example, the first electrode 211 is a transparent metal oxide electrode, such as indium tin oxide (ITO), aluminum zinc oxide (AZO), or the like. For example, the second electrode 212 can adopt a metal material, such as molybdenum, copper, magnesium, aluminum, or an alloy material thereof.

For example, the photosensitive element 206 can be a metal-semiconductor-metal type photosensitive element, and the light detection layer 213 forms a Schottky contact with the first electrode 211 and the second electrode 212, respectively. For example, the light detection layer 213 includes at least one of indium gallium arsenide (InGaAs), noncrystalline silicon, molybdenum sulfide, indium gallium zinc oxide, polycrystalline silicon, noncrystalline selenium, mercury iodide, lead oxide, microcrystalline silicon, nanocrystalline silicon, single crystal silicon, perylenetetracarboxylic acid benzimidazole, silicon nanowires and copper phthalocyanine (CuPc).

For example, in at least one example, the photosensitive element 206 further includes a dielectric layer 207, and the dielectric layer 207 is between the light detection layer 213 and at least one of the first electrode 211 and the second electrode 212. As shown in FIG. 2A, the dielectric layer 207 is between the first electrode 211 and the light detection layer 213; and in other examples, the dielectric layer can also be between the second electrode 212 and the light detection layer 213. Alternatively, a dielectric layer is between the first electrode 211 and the light detection layer 213, and another dielectric layer is between the second electrode 212 and the light detection layer 213. The dielectric layer is configured to improve the interface property between the electrode(s) and the light detection layer to reduce the leakage current of the photosensitive element 206 in the dark state, thereby improving the performance of the photosensitive element 206.

For example, the dielectric layer includes at least one of noncrystalline silicon nitride, noncrystalline silicon oxide, noncrystalline silicon oxynitride, polyimide (PI), polyvinyl carbazole (PVK), benzocyclobutene (BCB), transparent metal oxides and polystyrene.

The embodiments of the present disclosure form the dielectric layer 207 and the drive circuit 205 on different substrates so that the formation of the dielectric layer 207 is not limited by the tolerable temperature of the drive circuit 205. For example, studies show that in the case that the dielectric layer 207 is made of polyimide, the temperature for curing the polyimide needs to reach about 300° C. so that the dielectric layer 207 can have good tunneling characteristics. However, because the tolerable temperature of the resinous material (e.g., those used as an insulating layer material) in the drive circuit 205 is about 230° C., the curing temperature will be limited if the dielectric layer 207 is formed on the drive circuit 205, and thus it will be difficult to sufficiently cure the polyimide material. Insufficient curing will result in the presence of other groups in the polyimide, and the other groups will cause a deterioration of the breakdown and tunneling characteristics of the polyimide material in high-voltage operation, thereby adversely affecting the performance of the photosensitive element. In at least an embodiment of the present disclosure, because the dielectric layer 207 is formed on the first base 210, that is, the dielectric layer 207 and the drive circuit 205 are formed on different substrates, the process temperature of the dielectric layer 207 is no longer limited by the drive circuit 205, and the dielectric layer 207 can be subject to any desired treatment (e.g. sufficiently curing the polyimide), thereby improving the performance of the photosensitive element.

For example, the dielectric layer has a moderate thickness to allow the tunneling of the photogenerated current while blocking the leakage current in the dark state. For example, the thickness of the dielectric layer 207 is less than 1/10 of the thickness of the light detection layer. In an example, the dielectric layer 207 is made of polyimide, and has a thickness of 100 nm-300 nm; and the light detection layer 213 is made of noncrystalline silicon, and has a thickness greater than 4000 nm.

In another example, the photosensitive element 206 can also be a photodiode, and the light detection layer 213 includes a PN junction composed of a p-type semiconductor layer and an n-type semiconductor layer, or a PIN junction composed of a p-type semiconductor layer, an intrinsic (i-type) semiconductor layer, and an n-type semiconductor layer. For example, the first electrode 211 is formed on the first base 210, and the p-type semiconductor layer, the intrinsic semiconductor layer, and the n-type semiconductor layer are stacked and formed on the first electrode 211 in sequence.

As shown in FIG. 2A, the second substrate 22 includes a second base 220 and a drive circuit 205 formed on the second base 220, the drive circuit 205 includes a switching transistor 204, and the switching transistor 204 is configured to be coupled to the photosensitive element 206 to determine whether to read a photosensitive signal from the photosensitive element 206. The switching transistor 204 is, e.g., a thin film transistor, which includes a gate electrode 221, a gate insulating layer 225, an active layer 222, a source electrode 223 and a drain electrode 224.

The embodiments of the present disclosure do not limit the type, material, and structure of the switching transistor 204. For example, the switching transistor 204 can be a top-gate type thin film transistor, a bottom-gate type thin film transistor, or the like; the active layer of the switching transistor 204 can be made of noncrystalline silicon, polycrystalline silicon (low-temperature polycrystalline silicon or high-temperature polycrystalline silicon), oxide semiconductor (e.g., IGZO), etc.; and the switching transistor 204 can be n-type or p-type. The switching transistor 204 can also be a field effect transistor or other suitable type of switching device.

For example, the materials of the gate electrode 221, the source electrode 223 and the drain electrode 224 of the switching transistor 204 can include aluminum, aluminum alloy, copper, copper alloy or any other suitable material. The embodiments of the present disclosure are not limited in this aspect.

For example, the material of the gate insulating layer 225 can include an inorganic insulating material such as SiNx, SiOx, SiNxOy, or the like, an organic insulating material such as organic resin or the like, or other suitable materials. The embodiments of the present disclosure are not limited in this aspect.

It should also be note that the source electrode 223 and the drain electrode 224 of the switching transistor 204 are interchangeable in accordance with the corresponding circuit connection due to their symmetry of physical structures.

For example, in at least one example, the drive circuit 205 further includes a detection electrode 203, the detection electrode 203 is electrically connected to one of the source electrode 223 and the drain electrode 224 of the switching transistor 204, and is coupled to the photosensitive element 206; and correspondingly, the other one of the source electrode 223 and the drain electrode 224 of the switching transistor 204 is electrically connected to, for example, a detection line. As shown in FIG. 2A, the detection electrode 203 can be electrically connected to the source electrode 223 or the drain electrode 224 of the switching transistor 204 through a via-hole in the insulating layer 208, or can be directly formed on the source electrode 223 or the drain electrode 224 of the switching transistor 204 to form a lap joint structure. For example, the detection electrode 203 and the second electrode 212 of the photosensitive element 206 are overlapped with each other in the direction perpendicular to the first base 210 to form a capacitor structure, and the gap between the first substrate 21 and the second substrate 22 is filled with the insulating layer 209 to form a dielectric layer of the capacitor structure. For example, the material of the insulating layer 209 can be an insulating adhesive to bond the first substrate 21 to the second substrate 22. In the present embodiment, the capacitor structure is formed between the drive circuit 205 and the photosensitive element to achieve the coupling connection of the drive circuit 205 and the light detection layer 213.

It should be noted that in other embodiments, the drive circuit 205 can be directly electrically connected to the photosensitive element 206 to achieve the coupling connection of the drive circuit 205 and the light detection layer 213. For example, the first substrate 21 and the second substrate 22 can be assembled to form a cell and establish an electric connection through a conductive adhesive. That is, forming the light detection layer and the drive circuit on two substrates, respectively, does not affect the connection or coupling connection therebetween, and the specific connecting manner or coupling connecting manner depends on the circuit itself. The embodiments of the present disclosure do not limit the coupling connecting manner of the detection electrode 203 and the light detection layer 213.

For example, the detection electrode 203 can be made of a light blocking material to form a light blocking layer, which at least partially covers the switching transistor 204 with respect to the second substrate 22. The light blocking layer can prevent the active layer 222 of the switching transistor 204 from light radiation to affect the properties of the semiconductor layer. In another example, the light blocking layer can also be provided separately. For example, the light blocking layer can adopt a metal, a dark resin, or other opaque material.

For example, the source electrode 223 of the switching transistor 204 is electrically connected to a processing circuit 230 through a detection line, and the processing circuit is, for example, a signal reading and amplifying circuit. The first electrode 211 of the photosensitive element 206 is configured to receive a bias signal to form a photosensitive circuit.

Figure 2B:
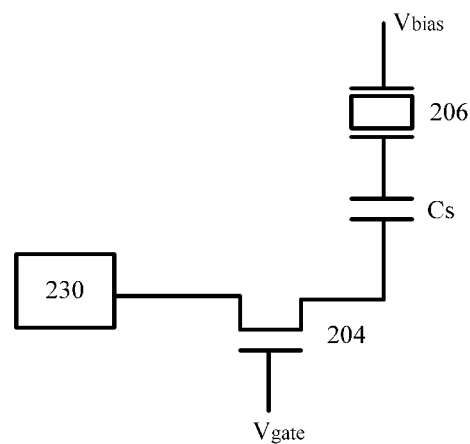
FIG. 2B is a schematic diagram of a photosensitive circuit of the detection panel as shown in FIG. 2A.

FIG. 2B shows a schematic diagram of an equivalent circuit of the photosensitive circuit in FIG. 2A, in which the capacitor and the photosensitive element are connected in series. A working process of the photosensitive circuit includes: in the reset phase, the control signal Vgate is a turn-on signal, the switching transistor 204 is turned on, and the processing circuit 230 writes a reset signal into the capacitor Cs through the switching transistor 204 to reset the capacitor; in the photosensitive phase, the control signal Vgate is a turn-off signal, the switching transistor 204 is turned off, and the photosensitive element 206 works under the action of the bias signal Vbias provided by the bias line, and generates a photosensitive signal upon light radiation which is stored in the capacitor Cs; in the reading stage, the control signal Vgate is a turn-on signal, the switching transistor 204 is turned on, the processing circuit 230 reads the photosensitive signal stored in the capacitor Cs through the switching transistor 204, and the processing circuit further performs amplification, analog-to-digital conversion and other processing on the photosensitive signal to obtain a digital signal, and transmits the digital signal to an image processing system (for example, CPU or GPU, etc.) of a computer to form an image.

For example, the detection panel further includes a scanning circuit, and the scanning circuit is electrically connected to the drive circuit 205 and configured to provide a scanning signal to control the drive circuit 205. For example, in the aforesaid reading phase, the gate drive circuit provides the control signal Vgate to the pixel units row by row to turn on the switching transistors of the pixel units row by row. For example, the scanning circuit is implemented as the gate drive circuit as shown in FIG. 1A. For example, an integrated circuit chip is electrically connected to the gate lines in a bonding manner. A gate drive circuit with GOA-type can include a plurality of cascaded shift register units, and the shift register unit can, for example, adopt 4T1C or other conventional structures in the art, which are not repeated here for simplicity.

For example, the bias signal Vbias received by the photosensitive element 206 is provided by the opposite substrate, that is, the second substrate 22. For example, the second substrate 22 is provided with a constant voltage source (e.g., a common electrode), which is electrically connected to the first electrode 211 of the first substrate 21 through a conductive silver paste or a conductive adhesive to provide the bias signal for the first electrode. For example, the conductive adhesive includes a bulk resin and conductive fillers, that is, conductive particles, and the conductive particles are bonded together by the bonding effect of the bulk resin to form a conductive path, thereby achieving the conductive connection of the bonded materials (e.g., the constant voltage source and the first electrode).

For example, the first base 210 and the second base 220 can be made of, for example, glass, plastic, quartz, or other suitable material. The embodiments of the present disclosure are not limited in this aspect.

Figure 3:
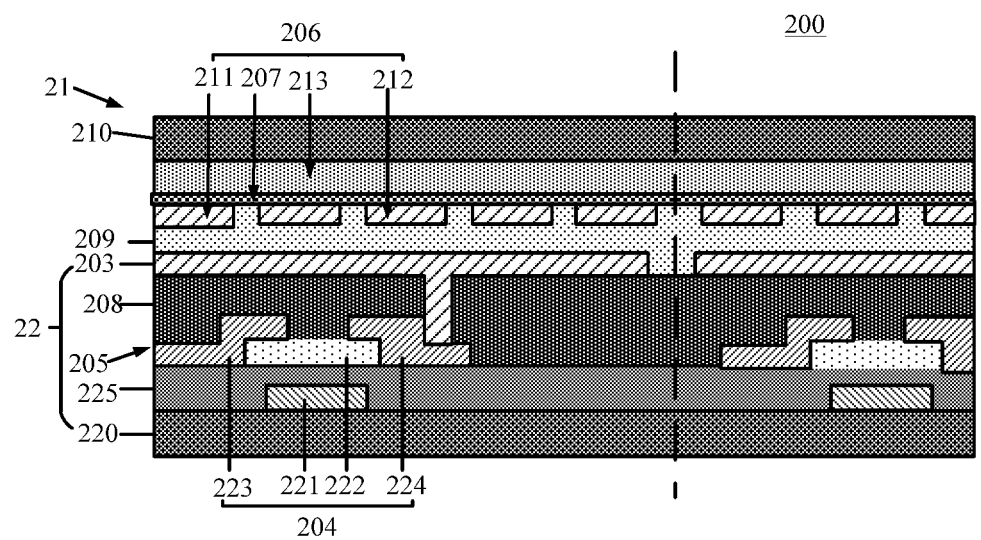
FIG. 3 is a schematic diagram of a cross-sectional structure of a detection panel provided by another embodiment of the present disclosure.

FIG. 3 shows a schematic diagram of a cross-sectional structure of a detection panel provided by another embodiment of the present disclosure. The structure of the detection panel of this embodiment differs from the structure of the detection panel as shown in FIG. 2A in that the photosensitive element 206 adopts a horizontal structure, that is, the first electrode 211 and the second electrode 212 are located at the same side of the light detection layer 213. As shown in FIG. 3, with respect to the first base 210, the first electrode 211 and the second electrode 212 are in the same layer and insulated from each other. For example, in an example, the first electrode 210 and the second electrode 212 can form the interdigital structure as shown in FIG. 1C, or other interdigital comb-shaped structure. For example, the light detection layer 213 is formed on the first base 210, and the first electrode 211 and the second electrode 212 are disposed at the side of the light detection layer 213 away from the first base 210. For example, the light detection layer 213 directly contacts the first base. For example, the dielectric layer 207 is between the first electrode 211 and the second electrode 212, and the light detection layer 213.

In the present embodiment, because the light detection layer 213 and the drive circuit 205 are formed on different substrates, and the electrode layer of the photosensitive element is formed after forming the light detection layer 213, the slope of the pattern of the drive circuit and the electrode layer do not affect the formation of the light detection layer 213, so that the flatness of the light detection layer 213 is improved and the defects are reduced, thereby reducing the leakage current in the dark state. Because the light detection layer 213 is closer to light incident side than the electrode layer, the pattern of the electrode layer does not occupy the photosensitive area, which helps to increase the photosensitive area and the filling rate of the photosensitive element 206.

For example, the materials of both the first electrode 211 and the second electrode 212 can be metals such as copper, aluminum, magnesium, molybdenum and any alloy thereof.

For example, the first electrode 211 and the second electrode 212 can also be formed on the second base 220. By assembling the first substrate 21 and the second substrate 22 to form a cell, the first electrode 211, the second electrode 212 and the light detection layer 213 form the photosensitive element 206.

The photosensitive circuit and the working principle of the detection panel can refer to the embodiment as shown in FIG. 2A to FIG. 2B, which are not repeated here for simplicity.

For example, the drive circuit 205 can be directly electrically connected to the photosensitive element 206 to achieve the coupling connection of the drive circuit 205 and the light detection layer 213.

FIG. 4A shows a schematic diagram of a cross-sectional structure of a detection panel provided by another embodiment of the present disclosure. In the detection panel, the light detection layer 213 and the first electrode 211 are formed on the first base 210, the detection electrode 203 of the second substrate 22 serves as the second electrode 212 of the photosensitive element 206, that is, the second electrode 212 is formed on the second base 220, and the detection electrode 203 directly contacts and is electrically connected to the second electrode 212 of the photosensitive element 206. The first substrate 21 and the second substrate 22 are bonded and fixed to each other by, for example, a sealant (not shown in FIG. 4A). In this case, a capacitor electrode 241 can be additionally provided to be opposite to the detection electrode 203 (that is, the second electrode 212) to form a capacitor, and the capacitor electrode 241 forms an electric connection with the first electrode 211 of the photosensitive element 206 (not shown in FIG. 4A), so that the capacitor and the photosensitive element 206 are connected in parallel. The embodiments of the present disclosure do not limit the connecting manner of the capacitor electrode 241 and the first electrode 211. For example, the capacitor electrode 240 and the first electrode 211 can be connected to the same constant voltage source to receive the same bias signal. For example, the capacitor electrode 241 and the gate electrode 221 of the switching transistor 204 can be formed in the same layer so as to saving the process.

Figure 4B:
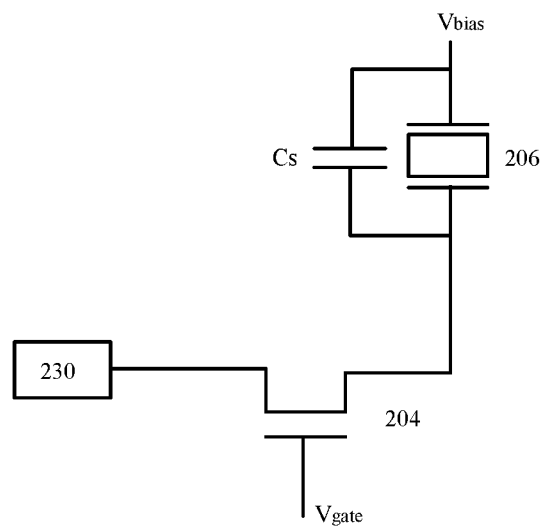
FIG. 4B is a schematic diagram of an equivalent circuit of the photosensitive circuit of the detection panel as shown in FIG. 4A.

FIG. 4B shows a schematic diagram of an equivalent circuit of the photosensitive circuit in FIG. 24, in which the capacitor and the photosensitive element are connected in series. A working process of the photosensitive circuit includes: in the reset phase, the control signal Vgate is a turn-on signal, the switching transistor 204 is turned on, and the processing circuit 230 writes a reset signal into the capacitor Cs through the switching transistor 204 to reset the capacitor; in the photosensitive phase, the control signal Vgate is a turn-off signal, the switching transistor 204 is turned off, the photosensitive element 206 works under the action of the bias signal Vbias provided by the bias line, and generates a photosensitive signal upon light radiation which is stored in the capacitor Cs; in the reading stage, the control signal Vgate is a turn-on signal, the switching transistor 204 is turned on, the processing circuit 230 reads the photosensitive signal stored in the capacitor Cs through the switching transistor 204, and the processing circuit further performs amplification, analog-to-digital conversion and other processing on the photosensitive signal to obtain a digital signal, and transmits the digital signal to an image processing system (for example, CPU or GPU, etc.) of a computer to form an image.

The diagrams of the equivalent circuits of the photoreceptor circuits as shown in FIG. 2B and FIG. 4B are only exemplary. For example, a reset circuit, an amplifying circuit, and the like are further included, for another example, the storage capacitor can also have other connection manners. The embodiments of the disclosure are not limited to the specific circuits as shown.

The embodiments of the present disclosure do not limit the manner of providing a capacitor for storing the photosensitive signal and the connection manner of the capacitor and the photosensitive element. For example, the capacitor may be formed with the photosensitive element in parallel or in series. Those skilled in the art can make the design flexibly in accordance with the process requirements. For example, in the case that the photosensitive element 206 is a photodiode, the capacitor may not be provided separately, but provided by the reverse bias capacitor of the photodiode.

At least an embodiment of the present disclosure further provides a method of manufacturing a detection panel. For example, the manufacturing method can be used to implement the detection panel provided by any embodiment of the present disclosure. Hereinafter the method of manufacturing the detection panel provided by the embodiments of the present disclosure will be exemplarily described by taking the detection panel shown in FIG. 2A as an example, with reference to FIG. 5A-FIG. 5B and FIG. 6.

Figure 5A:
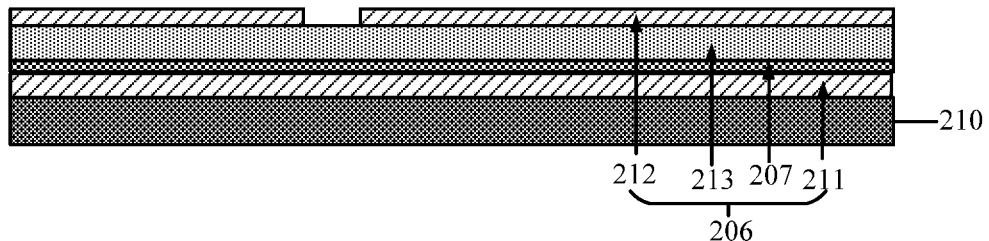
FIGS. 5A and 5B are structural schematic diagrams of the first substrate and the second substrate of a detection panel provided by an embodiment of the present disclosure, respectively.
Figure 5B:
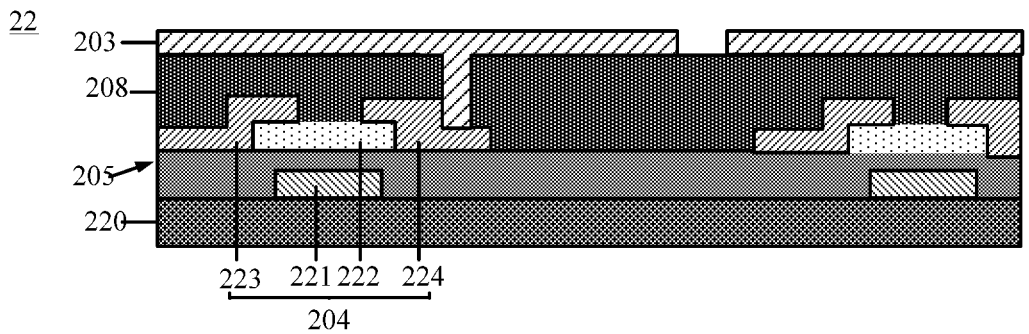
Figure 6:
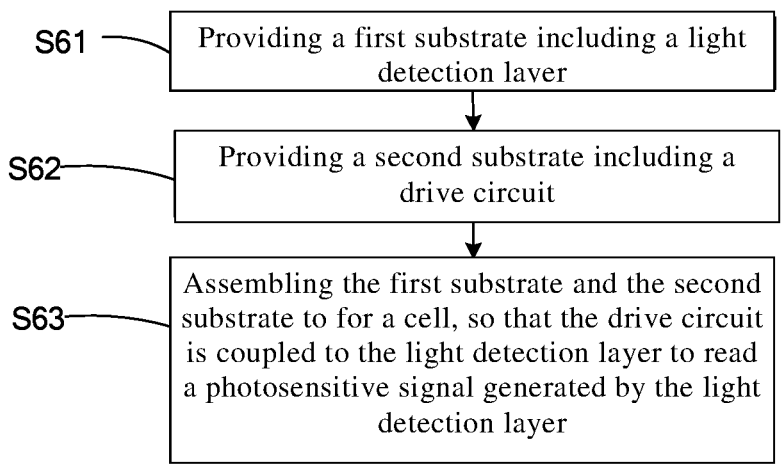
FIG. 6 is a flowchart of a method of manufacturing a detection panel provided by an embodiment of the present disclosure.

FIG. 5A and FIG. 5B show cross-sectional diagrams of the first substrate and the second substrate of a detection panel provided by the embodiment of the present disclosure, respectively; and FIG. 6 is a flowchart of a method of manufacturing a detection panel provided by an embodiment of the present disclosure.

As shown in FIG. 6, the method of manufacturing a detection panel at least includes step S61 to step S63.

Step S61: Providing a first substrate including a light detection layer;

Step S62: Providing a second substrate including a drive circuit; and

Step S63: Assembling the first substrate and the second substrate to form a cell, so that the drive circuit is coupled to the light detection layer to read a photosensitive signal generated by the light detection layer.

In an example of step S61, the first base is first provided, and then the light detection layer is formed on the first base. Moreover, a first electrode and/or a second electrode can also be formed on the first base to apply an electric signal to the light detection layer. For example, as shown in FIG. 5A, providing the first substrate 21 includes: forming the first electrode 211, the light detection layer 213 and the second electrode 212 on the first base 210 in sequence, and the first electrode 211, the second electrode 212 and the light detection layer 213 constitute the photosensitive element 206. In another example, it is also feasible to first form the light detection layer on the first base, and then form the first electrode and the second electrode on the light detection layer, and the first electrode and the second electrode are insulated from each other. In still another example, the first electrode 211 and the second electrode 212 can be both formed on the second base.

For example, the photosensitive element 206 is directly formed on the first base 210, that is, the photosensitive element 206 directly contacts the first base 210.

For example, the first electrode 211 is formed as a planar electrode, and the second electrode 212 is formed as a block electrode or a slit electrode, that is, the first electrode 211 is formed as an entire surface structure on the first base 210. For example, the second electrodes in two adjacent pixel units are disconnected at the boundary of the pixel units for insulation. FIG. 2A schematically shows the switching transistor 304 and photosensitive element 306 in the pixel unit adjacent to the pixel unit where the photosensitive element 206 is located. As shown in FIG. 2A, the photosensitive element 306 and the photosensitive element 206 share the same first electrode, and the second electrode 312 of the photosensitive element 306 and the second electrode 212 of the photosensitive element 206 are in the same layer and insulated from each other.

For example, the first electrode 211 can be a transparent electrode to improve the light transmittance. For example, the first electrode 211 is a transparent metal oxide electrode, such as indium tin oxide (ITO), aluminum zinc oxide (AZO), or the like. For example, the second electrode 212 can adopt a metal material, such as molybdenum, copper, magnesium, aluminum, or an alloy material thereof.

For example, the photosensitive element 206 is implemented as a metal-semiconductor-metal type photosensitive element, and the light detection layer 213 forms a Schottky contact with the first electrode 211 and the second electrode 212, respectively. For example, the light detection layer 213 includes at least one of indium gallium arsenide (InGaAs), noncrystalline silicon, molybdenum sulfide, indium gallium zinc oxide, polycrystalline silicon, noncrystalline selenium, mercury iodide, lead oxide, microcrystalline silicon, nanocrystalline silicon, single crystal silicon, perylenetetracarboxylic acid benzimidazole, silicon nanowires and copper phthalocyanine (CuPc).

For example, providing the first substrate 21 further includes forming the dielectric layer 207, for example, the dielectric layer is formed between the light detection layer 213 and at least one of the first electrode 211 and the second electrode 212. The dielectric layer is configured to improve the interface property between the electrode(s) and the light detection layer to reduce the leakage current of photosensitive element 206 in the dark state.

For example, the dielectric layer includes at least one of noncrystalline silicon nitride, noncrystalline silicon oxide, noncrystalline silicon oxynitride, polyimide (PI), polyvinyl carbazole (PVK), benzocyclobutene (BCB), transparent metal oxides and polystyrene.

In another example, the photosensitive element 206 can also be implemented as a photodiode. In this case, the light detection layer 213 can be implemented as, for example, a PN junction or a PIN junction to form a PN-type photodiode or a PIN-type photodiode. The embodiments of the present disclosure do not limit the type of the photosensitive element 206.

In an example of step S62, the second base is first provided, and then the drive circuit is formed on the second base, for example, the drive circuit is manufactured by a semiconductor process. For example, as shown in FIG. 5B, forming the drive circuit 205 includes forming the switching transistor 204, and the method of forming the switching transistor 204 includes, for example, forming the gate electrode 221, the gate insulating layer 225, an active layer 222, the source electrode 223 and the drain electrode 224 on the second base 220. For example, during the manufacturing process, it is feasible to adopt a conventional physical vapor deposition process, for example, a sputtering process (for example, forming a conductive layer), a chemical vapor deposition process (for example, forming an insulating layer), a spin coating process (for example, forming an organic layer), a photolithographic process (for example, perform a patterning process), etc.

For example, providing the second substrate further includes forming a detection electrode 203 on the second base, and the detection electrode is electrically connected to the source electrode 223 or the drain electrode 224 of the switching transistor 204. For example, as shown in FIG. 5B, the detection electrode is electrically connected to the source electrode 223 or the drain electrode 224 of the switching transistor 204 through a via-hole in the insulating layer 208. In another example, the detection electrode can also be directly formed on the source electrode 223 or the drain electrode 224 of the switching transistor 204 to form a lap joint structure.

In step S63, for example, the first substrate 21 and the second substrate 22 are subject to be assembled to form a cell as shown in FIG. 2A, so that the drive circuit 205 is coupled to the photosensitive element 206 to read a photosensitive signal generated in the light detection layer 213 from the photosensitive element 206, for example, the first substrate 21 and the second substrate 22 are bonded and fixed with a sealant. For example, the detection electrode 203 and the second electrode 212 of the photosensitive element 206 are overlapped with each other in a direction perpendicular to the first base 210 to form a capacitor to achieve the coupling connection of the drive circuit 205 and the photosensitive element 206. For example, the gap between the first substrate 21 and the second substrate 22 can be filled with an insulating layer 209 to separate the first substrate 21 from the second substrate 22 and form the dielectric layer of the capacitor. For example, the material of the insulating layer 209 can be an insulating adhesive to further bond the first substrate 21 and the second substrate 22.

In another example, referring to FIG. 4A, the first substrate 21 and the second substrate 22 are assembled to form a cell, so that the drive circuit 205 is directly electrically connected to the photosensitive element 206. In this example, for example, the second electrode 212 is formed on the second base 220, the detection electrode 203 is electrically connected to the second electrode 212, or the detection electrode 203 directly serves as the second electrode. In the case where the first substrate 21 and the second substrate 22 are assembled to form a cell, for example, by a conductive adhesive or an insulating adhesive, the second electrode 212 and the light detection layer 213 of the first substrate 21 are coupled to form the photosensitive element. In this case, for example, the capacitor can be provided separately. For specific descriptions, please refer to the introduction of the embodiment as shown in FIG. 4A, which are not repeated here for simplicity.

In the method of manufacturing the detection panel provided by the embodiments of the present disclosure, the light detection layer and the drive circuit are formed on two substrates, respectively. On one hand, in at least some embodiments, it helps to provide a flat formation interface for the light detection layer, thereby reducing the defects of the light detection layer and improving the performance of the photosensitive element; on another hand, the separation design can reduce the number of processes on a single substrate (for example, avoiding more than 10 photomask processes) to reduce the production pressure, which not only helps to improve the product yield, but also can improve the production efficiency; and on still another hand, the first substrate for forming the light detection layer can protect the second substrate for forming the drive circuit.

What have been described above are only specific implementations of the present disclosure, the protection scope of the present disclosure is not limited thereto, and the protection scope of the present disclosure should be based on the protection scope of the claims.

What is claimed is:

1. A detection panel, comprising a first substrate and a second substrate, wherein
the first substrate comprises a light detection layer;
the second substrate comprises a drive circuit; and
the first substrate and the second substrate are opposite to each other and bonded with a conductive adhesive or an insulated adhesive for cell assembly, and the drive circuit is coupled to the light detection layer to read a photosensitive signal generated by the light detection layer, wherein the conductive adhesive or the insulated adhesive which is used to bond the first substrate and the second substrate is located between the light detection layer and the drive circuit.

2. The detection panel according to claim 1, wherein the first substrate further comprises a first electrode and a second electrode; and
the first electrode, the second electrode and the light detection layer constitute a photosensitive element.

3. The detection panel according to claim 2, wherein the first substrate further comprises a first base, the photosensitive element is located on the first base, and
at least one of the first electrode and the second electrode is located at a side of the light detection layer away from the first base.

4. The detection panel according to claim 3, wherein the first electrode, the light detection layer, and the second electrode are stacked on the first base in sequence.

5. The detection panel according to claim 4, wherein the first electrode is provided as an entire surface, and the second electrode is a block electrode or a slit electrode.

6. The detection panel according to claim 3, wherein the first electrode is in direct contact with the first base.

7. The detection panel according to claim 3, wherein the first electrode and the second electrode are both located at the side of the light detection layer away from the first base.

8. The detection panel according to claim 7, wherein the first electrode and the second electrode are in the same layer and insulated from each other.

9. The detection panel according to claim 2, wherein the photosensitive element further comprises a dielectric layer, and the dielectric layer is between the light detection layer and at least one of the first electrode and the second electrode.

10. The detection panel according to claim 2, wherein the first substrate further comprises a first base and a buffer layer between the first base and the photosensitive element, and
the buffer layer is provided as an entire surface and in direct contact with the first base.

11. The detection panel according to claim 2, wherein the drive circuit comprises a switching transistor, and the switching transistor is configured to be coupled to the light detection layer to determine whether to read the photosensitive signal from the light detection layer.

12. The detection panel according to claim 11, wherein the drive circuit further comprises a detection electrode, and the detection electrode is electrically connected to a source electrode of the switching transistor or a drain electrode of the switching transistor, and is coupled to the photosensitive element.

13. The detection panel according to claim 12, wherein the detection electrode is electrically connected to the second electrode of the photosensitive element or forms a capacitor with the second electrode of the photosensitive element.

14. The detection panel according to claim 1, wherein the first substrate further comprises a first electrode, and the second substrate further comprises a second electrode; and
the first electrode, the second electrode and the light detection layer constitute a photosensitive element.

15. The detection panel according to claim 1, wherein the second substrate further comprises a first electrode and a second electrode; and
the first electrode, the second electrode and the light detection layer constitute a photosensitive element.

16. A method of manufacturing a detection panel, comprising:
providing a first substrate, wherein the first substrate comprises a light detection layer;
providing a second substrate, wherein the second substrate comprises a drive circuit; and
bonding the first substrate and the second substrate to form a cell by using a conductive adhesive or an insulated adhesive, so that the drive circuit is coupled to the light detection layer to read a photosensitive signal generated by the light detection layer,
wherein the conductive adhesive or the insulated adhesive which is used to bond the first substrate and the second substrate is located between the light detection layer and the drive circuit.

17. The method according to claim 16, wherein the first substrate comprises a first base, and providing the first substrate comprises:
forming a first electrode, the light detection layer and a second electrode on the first base in sequence; wherein
the first electrode, the second electrode and the light detection layer constitute a photosensitive element.

18. The method according to claim 17, wherein forming the first electrode, the light detection layer and the second electrode on the first base in sequence comprises:
forming the first electrode as a planar electrode and forming the second electrode as a block electrode or a slit electrode.

19. The method according to claim 17, wherein providing the first substrate further comprises forming a dielectric layer, wherein
the dielectric layer is formed between the light detection layer and at least one of the first electrode and the second electrode.

20. The method according to claim 16, wherein the first substrate comprises a first base, and providing the first substrate comprises:
forming the light detection layer on the first base,
forming the first electrode and the second electrode on the light detection layer; wherein
the first electrode, the second electrode and the light detection layer constitute a photosensitive element.

* * * * *